United States Patent
Podlesny et al.

(10) Patent No.: US 6,373,149 B1
(45) Date of Patent: Apr. 16, 2002

(54) POWER SUPPLY CONTROL FOR LOW VOLTAGE CIRCUITS USING HIGH THRESHOLD SWITCH TRANSISTORS

(75) Inventors: Andrew V. Podlesny; Alexander V. Malshin, both of Moscow (RU)

(73) Assignee: Elbrus International Limited, George Town Grand Cayman (KY)

(*) Notice: Subject to any disclaimer, the term of this patent is extended or adjusted under 35 U.S.C. 154(b) by 0 days.

(21) Appl. No.: 09/505,655

(22) Filed: Feb. 17, 2000

Related U.S. Application Data

(60) Provisional application No. 60/120,358, filed on Feb. 17, 1999.

(51) Int. Cl.[7] .................................................. H02J 1/10
(52) U.S. Cl. ........................................................ 307/28
(58) Field of Search ..................... 307/28–42; 327/530, 327/540–543

(56) References Cited

U.S. PATENT DOCUMENTS

| | | | |
|---|---|---|---|
| 5,486,774 A | 1/1996 | Douseki et al. | 326/33 |
| 5,594,371 A | 1/1997 | Douseki | 326/119 |

OTHER PUBLICATIONS

Shi'ichiro Mutoh, et al., 1–V Power Supply High–Speed Digital Circuit Technology with Multithreshold–Voltage CMOS, IEEE Journal of Solid–State Circuits, vol. 30, No. 8, Aug. 1995, pp. 847–854.

Shin'ichiro Mutoh, et al.,1–V High–Speed Digital Circuit Technology with 0.5 $\mu$m Multi–Threshold CMOS, IEEE 1993, pp. 186–189.

Satoshi Shigematsu, et al., A 1–V High–Speed MTCMOS Circuit Scheme for Power–Down Applications, 1995 Symposium of VLSI Circuits Digest of Technical Papers, pp. 125–126.

Takakuni Douseki, et al., A 0.5V SIMOX–MTCMOS Circuit with 200ps Logic Gate, 1966 IEEE International Solid–State Circuits Conference, Session 5, Paper TP 5.4, pp. 84–85.

Keith Diefendorff, Microprocessor Report, The Insiders' Guide to Microprocessor Hardware, The Russians Are Coming, Supercomputer Maker Elbrus Seeks to Join x86/IA–64 Melee, Feb. 15, 1999, vol. 13, No. 2, pp. 1–7.

*Primary Examiner*—Peter S. Wong
*Assistant Examiner*—Pia Tibbits
(74) *Attorney, Agent, or Firm*—Townsend and Townsend and Crew LLP

(57) ABSTRACT

A power system for controlling power to low voltage CMOS circuits. The power system can be used in circuits having a low voltage supply and a high voltage supply, wherein the low voltage supply powers low voltage circuit components and the high voltage supply powers high voltage circuit components. The power system comprises a first switch coupled between the low voltage supply and the low voltage circuit components, a second switch coupled between the low voltage circuit components and a circuit ground, and a power control circuit coupled to the high voltage supply and the circuit ground and having a control output coupled to the first and second switches, wherein when the control output is in a first state the low voltage supply and the circuit ground are connected to the low voltage circuit components and when the control output is in a second state the low voltage supply and the circuit ground are disconnected from the low voltage circuit components.

17 Claims, 2 Drawing Sheets

POWER SUPPLY CONTROL FOR LOW VOLTAGE CIRCUITS USING HIGH THRESHOLD SWITCH TRANSISTORS

CROSS-REFERENCES TO RELATED APPLICATIONS

This application claims priority from co-pending U.S. Provisional Patent Application 60/120,358 filed on Feb. 17, 1999, the disclosure of which is incorporated herein in its entirety for all purposes.

FIELD OF THE INVENTION

This invention is related to power supply control circuits, and in particular, to a power supply control circuit for use with low voltage CMOS circuitry.

BACKGROUND OF THE INVENTION

Conventional methods for saving standby power consumed by low voltage CMOS (LVCMOS) circuits, which use MOS transistors to switch on/off power supply buses to low voltage components are implemented using one or more of several techniques. For example, in one technique MOS transistors with low threshold voltages (i.e. 100 to 200 millivolts) are used as bus switching transistors. The disadvantage of this is that the MOS transistors have high subthreshold currents which result in high standby power.

In another technique, MOS transistors with high threshold voltages (i.e. 500 to 700 millivolts) are used as the bus switching transistors. One disadvantage of this is that the transistors have high series resistance which lowers speed. Another disadvantage is that the series resistance is highly sensitive to process variations.

In another technique, NMOS transistors are used to switch the negative or ground power bus (Vss) and PMOS transistors are used to switch the positive power bus (Vdd). The disadvantage here is the large size of the PMOS transistors.

In another technique, the power buses are switched by MOS transistors that are gate-controlled by the same voltages as logic transistors. This also has the disadvantage of high series resistance and corresponding low speed.

Unfortunately, in addition to the disadvantages discussed above other problems may arise when the power supply voltage is decreased, for example, to 1 volt or less. As a result of decreasing the power supply voltage, the threshold of high threshold transistors must be reduced, thus leading to an increase in standby power consumption.

SUMMARY OF THE INVENTION

The present invention includes an active/sleep mode power supply control circuit for use with low voltage CMOS circuitry in applications where both high voltage and low voltage power supplies are used. The control circuit includes NMOS transistors with high threshold voltages as switches in both the low voltage power supply and ground buses coupling power to the low voltage circuitry. Incorporating an NMOS switch in both power supply buses allows the size of the control circuit to be small and provides a low series resistance when both switches are switched ON. To achieve the low series resistance, the high threshold voltage NMOS transistors are gate-controlled by a high voltage signal. As a result, the control circuit provides to the low voltage circuits, high speed in the active mode and low power consumption in the sleep mode.

In an embodiment of the present invention a power system for controlling power in a circuit is provided. The power system may be used in circuits having a low voltage supply and a high voltage supply, wherein the low voltage supply powers low voltage circuit components and the high voltage supply powers high voltage circuit components. The power system comprises a first switch coupled between the low voltage supply and the low voltage circuit components, a second switch coupled between the low voltage circuit components and a circuit ground, and a power control circuit coupled to the high voltage supply and the circuit ground and having a control output coupled to the first and second switches, wherein when the control output is in a first state the low voltage supply and the circuit ground are connected to the low voltage circuit components and when the control output is in a second state the low voltage supply and the circuit ground are disconnected from the low voltage circuit components.

DESCRIPTION OF THE SPECIFIC EMBODIMENTS

The present invention includes an active/sleep mode power supply control circuit that saves power dissipated by LVCMOS circuits while in sleep mode and may be used with circuits having two voltage supplies. For example, embodiments of the present invention are suitable for use where a low voltage supply is used for core low voltage circuits and a high voltage supply is used for periphery and supported circuits.

Figure 1:
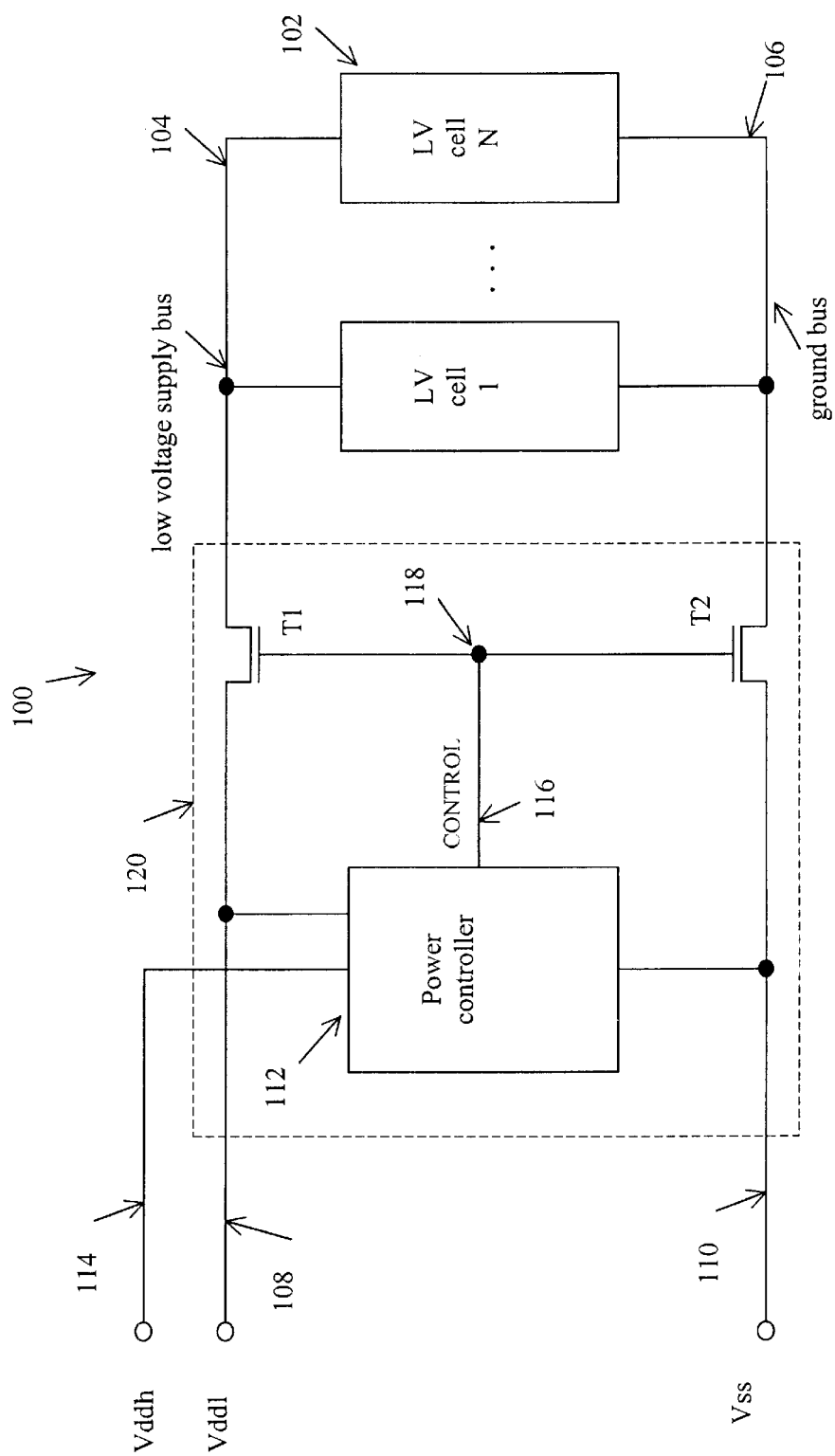
FIG. 1 shows a power supply control circuit constructed in accordance with the present invention.

FIG. 1 shows a system 100 incorporating an active/sleep power mode supply control circuit (120) constructed in accordance with the present invention. As shown, the system 100 includes up to N low voltage cells 102 coupled between a low voltage power supply bus 104 and a ground bus 106. In turn, the control circuit 120 includes two NMOS pass-transistor switches T1 and T2 to respectively connect the low voltage power supply and ground busses 104, 106 to a low voltage supply (Vddl) line 108 and a ground line (Vss) 110. The transistors T1 and T2 are constructed to have high voltage thresholds (Vt,h) in the approximate range of 0.5–1.0 volts. A control line 116 is coupled to the gate terminals of T1 and T2 at point 118. The low voltage supply, Vddl, at line 108 is less than or equal to approximately 1.5 volts, and the high voltage supply, Vddh, at line 114 is in the approximate range of 3–5volts.

Figure 2:
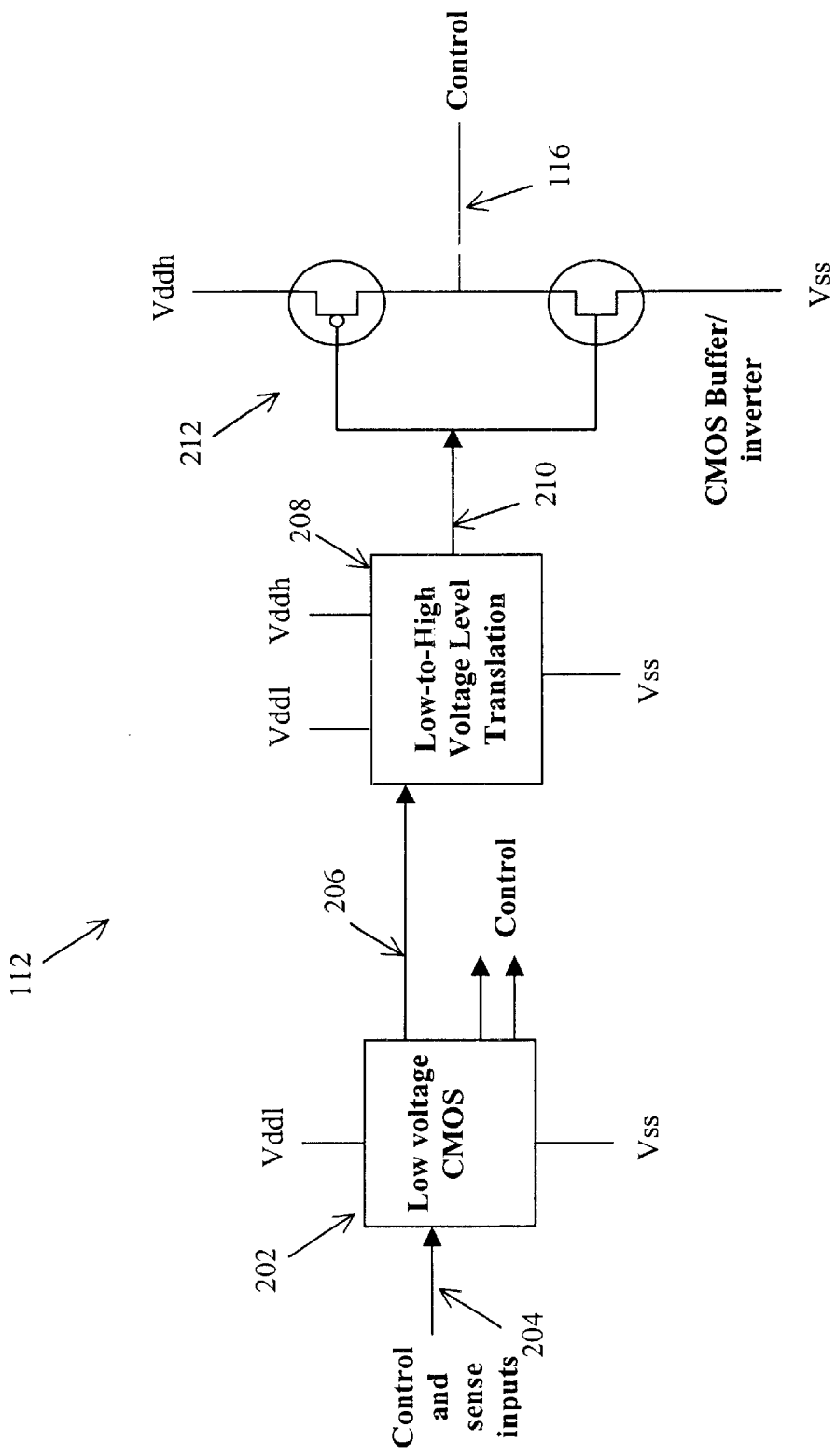
FIG. 2 shows a control circuit constructed in accordance with the present invention.

FIG. 2 shows an embodiment of the power supply control circuit 112 in accordance with the present invention. A low voltage CMOS circuit 202 coupled to Vddl and Vss, receives control and sense inputs 204 to produce therefrom control signals 206. One of the control signals 206 is coupled to a level translation circuit 208. The level translation circuit converts signals based on Vddl to signals based on Vddh to form a translation output 210. The translation output 210 is coupled to a CMOS inventor/buffer 212. The inventor/buffer 212 is coupled to Vddh by a PMOS transistor and to Vss by an NMOS transistor of the inventor/buffer 212 and produces the control signal 116.

The low voltage CMOS circuit will, in response to the control and sense inputs on line 204 of one state, produce a low voltage signal on line 206 of a first or second state to turn on or off the NMOS transistors T1, T2. That low voltage signal is translated to a high voltage signal by the level translation circuit 208 where it will appear on signal line 210. If the control and sense input on line 204 seeks to turn on the NMOS transistors T1, T2, the signal applied to line 210 will be a LOW (e.g., approximately Vss) to turn on the PMOS transistor, and turn off the NMOS transistor of the CMOS buffer/inventor 212. In turn, with the PMOS transistor conducting, Vddh will be applied to the control line 116 and thereby to the gate leads of the NMOS transistors to turn them on and connect the low power supply and ground lines 108, 110 to the low voltage circuitry 102, Conversely, a control and sense input on line 204 of another state can ultimately cause a HIGH to be applied to the line 210 to turn off the PMOS transistor and turn on the NMOS transistor of the CMOS buffer/inventor 212 to thereby pull the control line 116 to the Vss potential. This, in turn, will turn off the NMOS transistors to, in effect, disconnect the low voltage circuits 102 from the low voltage supply and ground lines 108, 110.

Referring again to FIG. 1, during operation of the power system 120, the transistors T1 and T2 respectively connect the Vddl bus 104 and the ground bus 106 of the low voltage circuits to the low voltage supply, Vddl, line 108 and the ground Vss 110, when the control signal 116 has a high level (i.e. Vcontr,h=Vddh). Alternatively, the transistors T1 and T2 disconnect the Vddl bus 104 and the ground bus 106 of the low voltage circuits from the power supply Vddl 108 and the ground Vss 110, when the control signal 116 has a low level (i.e. Vcontr,l=Vss).

Only a small voltage drop across the switches T1 and T2 is presented when they are in their power-ON state due to the large values of the effective control voltages (Vcontr,eff) applied to their gate leads by the control signal 116. For example, the effective control voltages applied to the transistors T1 and T2 for conduction can be expressed in terms of their gate to source (Vgs) and threshold (Vt) voltages as:

Vcontr,eff (T1)=Vgs(T1)−Vt=Vddh−Vddl−Vt,h

Vcontr,eff (T2)=Vgs(T2)−Vt=Vddh−Vt,h

The small voltage drops across the switches T1 and T2 are based on the MOS dependency of the drain-to-source resistance Rds, which is a function of the effective control voltage Vcontr,eff. For example, the drain-to-source resistance of the transistors T1 and T2 can be expressed as:

$$Rds=1/(K1 * Vcontr,eff)=1/(K1 * (Vgs-Vt,h)) \quad (1)$$

where K1 is a MOS device transconductance. Thus, the series resistance Rds of the power switch transistor decreases as the high voltage supply Vddh increases.

The transistors T1 and T2 also provide small leakage currents in the power-OFF state due to the capacity to increase the switches thresholds Vt,h up to a range of 0.5–1.0 volts while maintaining sufficient values of the effective control voltages. For example, the subthreshold leakage current Ileak based on the threshold voltage Vt may be expressed as:

$$Ileak=K2*exp(-Vt). \quad (2)$$

where K2 is a scaling factor. Thus, it is possible to reduce leakage current by increasing the threshold voltage Vt,h.

The present invention provides a power supply control circuit for use with low voltage CMOS circuitry. It will be apparent to those with skill in the art that modifications to the above embodiments can occur without deviating from the scope of the present invention. Accordingly, the disclosures and descriptions herein are intended to be illustrative, but not limiting, of the scope of the invention which is set forth in the following claims.

What is claimed is:

1. A power system for controlling power in a circuit having a low voltage supply, a high voltage supply and a system ground, wherein the low voltage supply powers low voltage circuit components, the power system comprising:

a switch circuit (T1, T2) coupled to the low voltage circuit components, said switch circuit having a switch input to receive a control signal having a first state that causes said switch circuit to couple said low voltage supply to said low voltage circuit components, and a second state that causes said switch circuit to de-couple said low voltage supply from said low voltage circuit components; and a power controller (112) coupled to the high voltage supply and having a control output coupled to the switch input; said power controller having logic to output the control signal on the control output.

2. The power system of claim 1, wherein the control signal is a voltage substantially equal to the high voltage supply when in the first state and substantially equal to the system ground when in the second state.

3. The power system of claim 1, wherein the switch circuit comprises:

a first switch coupled between the low voltage supply and the low voltage circuit components, said first switch having a first switch control input coupled to the control output; and a second switch coupled between the low voltage circuit components and a circuit ground, said second switch having a second switch control input coupled to the control output.

4. The power system of claim 3, wherein the first switch is a first pass transistor and the first switch control input is a gate terminal of the first pass transistor, and the second switch is a second pass transistor and the second switch control input is a gate terminal of the second pass transistor.

5. The power system of claim 4, wherein the gate terminals of the first pass transistor and the second pass transistor are connected together.

6. The power system of claim 4, wherein the first pass transistor and the second pass transistor are N-type MOS transistors.

7. The power system of claim 6, wherein the first and second pass transistors each have a threshold voltage substantially in the range of 0.5 to 1.0 volts.

8. In a voltage supply system having a low voltage source supplying a low voltage, a ground, and high voltage source supplying a high voltage, a control circuit for selectively applying the low voltage and the ground to a low voltage circuit in response to a control signal, comprising:

first and second NMOS pass transistors, each having a gate lead and each fabricated to have a threshold voltage in the approximate range of 0.5–1.0 volts, respectively coupling the high voltage supply and the ground to the low voltage circuit;

a power controller coupled to the high voltage supply to apply the control signal to the gate leads of the first and second NMOS pass transistors to cause the low voltage supply and the ground to be electrically coupled to the low voltage circuit.

9. The control circuit of claim 8, wherein the high voltage is in the approximate range of 3–5 volts.

10. The control circuit of claim 9, wherein the low voltage is less than or equal to approximately 1.5 volts.

11. The control circuit of claim 10, wherein the power controller includes a CMOS inverter circuit coupled between the high voltage and ground, the CMOS inverter circuit having a control lead coupled to the gate leads of the first and second NMOS transistors for communicating the select signal.

12. The control circuit of claim 11, wherein the CMOS inverter circuit comprises a series connected PMOS and NMOS transistors.

13. The control circuit of claim 11, wherein PMOS transistor has a drain lead connected to receive the high voltage and a source lead connected to the gate leads of the first and second NMOS pass transistors.

14. A switch for selectively coupling or de-coupling a low voltage to a low voltage circuit, comprising:

a high voltage that is greater in magnitude than the low voltage;

a ground;

a pair of NMOS transistors having interconnected gate leads and drain and source leads respectively coupling the low voltage and ground to the low voltage circuit, each of the pair of NMOS transistors being fabricated to have a threshold voltage in the range of 0.5–1.0 volts; and a control circuit coupled to receive the high voltage to apply a control signal to the interconnected gate leads of the pair of NMOS transistors to cause the NMOS transistors to electrically connect the low voltage and the ground to the low voltage circuit.

15. The switch of claim 14, wherein the low voltage is approximately 1.5 volts or less, and the high voltage is at least 3 volts.

16. The switch of claim 15, wherein the control circuit includes a CMOS inverter circuit coupled to receive the high voltage, the CMOS inverter circuit having a control lead coupled to the interconnected gate leads of the pair of NMOS transistors for applying the control signal.

17. The switch of claim 14, wherein removal of the control signal causes the pair of NMOS transistors to de-couple the low voltage circuit from the low voltage and the ground.

* * * * *